(12) United States Patent
Ahn

(10) Patent No.: US 6,734,048 B2
(45) Date of Patent: May 11, 2004

(54) THIN FILM TRANSISTOR LIQUID CRYSTAL DISPLAY AND FABRICATION METHOD THEREOF

(75) Inventor: Jae Jun Ahn, Ulsan (KR)

(73) Assignee: LG.Philips LCD Co., Ltd., Seoul (KR)

( * ) Notice: Subject to any disclaimer, the term of this patent is extended or adjusted under 35 U.S.C. 154(b) by 3 days.

(21) Appl. No.: 10/142,960

(22) Filed: May 13, 2002

(65) Prior Publication Data

US 2002/0168790 A1 Nov. 14, 2002

(30) Foreign Application Priority Data

May 14, 2001 (KR) ........................................ 2001-26193

(51) Int. Cl.[7] .............................................. H01L 21/00
(52) U.S. Cl. ...................... 438/149; 257/336; 257/59; 257/72; 257/347; 257/408
(58) Field of Search .................. 438/149; 257/336, 257/59, 72, 347, 408

(56) References Cited

U.S. PATENT DOCUMENTS 6,459,465 B1 * 10/2002 Lee ............................ 349/141

FOREIGN PATENT DOCUMENTS

| JP | 03-261005 | 11/1991 |
|----|-----------|---------|
| KR | 95-20453  | 7/1995  |

* cited by examiner

*Primary Examiner*—Caridad Everhart
*Assistant Examiner*—V. Yesikov
(74) *Attorney, Agent, or Firm*—Morgan, Lewis & Bockius LLP

(57) ABSTRACT

A method of fabricating a thin film transistor-liquid crystal display (TFT-LCD), which includes providing a substrate with a plurality of pixels. A thin film transistor (TFT) is formed in each of the plurality of pixels. A passivation layer is deposited over the substrate, and a pixel electrode is formed in each of the plurality of pixels. A TFT-LCD device, which includes a substrate having a plurality of pixels, a TFT in each of the plurality of pixels, and a first pixel electrode formed in each of the plurality of pixels. The first electrode pixel is connected with a drain electrode of the TFT. The TFT includes a gate electrode and an insulating layer on the substrate, an active layer formed on the insulating layer, source and drain electrodes formed over the gate electrode and at opposing ends of the active layer, and a passivation layer exposing a part of the drain electrode.

7 Claims, 6 Drawing Sheets

THIN FILM TRANSISTOR LIQUID CRYSTAL DISPLAY AND FABRICATION METHOD THEREOF

BACKGROUND OF THE INVENTION

The present invention relates to a rework method for indium tin oxide (ITO) in a thin film transistor-liquid crystal display (TFT-LCD), and more particularly, to a rework method for Indium Tin Oxide in TFT-LCD, capable of reworking the point defect by re-depositing Indium Tin Oxide if a point defect is found in testing after depositing ITO used as a pixel electrode of a TFT-LCD.

FIG. 1 is a conventional unit pixel plan view showing a TFT-LCD. As shown therein, a gate line 2 and a data line 6 are arranged to cross with each other, and a pixel electrode 8, which is made using a transparent metal such as ITO, is disposed in a pixel area which is proximate the gate line 2 and the data line 6. A gate insulating film (not shown) is disposed between the gate line 2 and the data line 6 in order to insulate them electrically. A thin film transistor (TFT) is formed around an intersection of the gate line 2 and the data line 6 in order to control driving of a respective pixel.

The TFT includes a gate electrode 2A, which is a part of the gate line 2, the gate insulating film (not shown), which covers the gate electrode 2A, an active area formed on the gate insulating film as a pattern form, and a source electrode 6A and a drain electrode 6B formed on the active area to be apart a certain distance from each other. In addition, the drain electrode 6B is electrically connected to the pixel electrode 8 through a contact hole 9.

FIGS. 2A–2D are sectional views sequentially illustrating a method for fabricating a TFT taken along section line A–A' of FIG. 1 according to the conventional art.

As a first step (FIG. 2A), a gate electrode 2A is formed on a glass substrate 1, and a gate insulating layer 3, an amorphous silicon 4, and an $n^+$ amorphous silicon 5 having a high density n-type ions injected therein are sequentially formed thereon. Then, patterning of the $n^+$ amorphous silicon 5 and the amorphous silicon 4 is done by a photolithography process to form an active region above the gate insulting layer 3 corresponding to the upper portion of the gate electrode 2A.

As a second step (FIG. 2B), a source 6A and a drain 6B are formed by depositing a metal on the upper surface of the above structure in FIG. 2A and then patterned to form respective portions separated by a certain distance from the center portion of the $n^+$ amorphous silicon 5. The source and drain 6A, 6B extend over the end portions of the amorphous silicon 4 and the $n^+$ amorphous silicon 5, and onto a portion of the gate insulating layer 3. Here, portions of the $n^+$ amorphous silicon 5 exposed between the source and drain portion 6A, 6B, and an upper portion of the amorphous silicon 4 are etched to define a channel region.

As a third step (FIG. 2C), a passivation layer 7 is deposited onto the structure of FIG. 2B and a contact hole 9 is formed through a portion of the passivation layer 7 using a photolithography process to expose an upper portion of the drain 6B.

As a fourth step (FIG. 2D), an ITO electrode 8 is deposited onto the structure of FIG. 2C and then patterned to form a pixel being connected with the exposed drain 6B.

Hereinafter, the method for fabricating a TFT in accordance with the conventional art will be described in more detail.

First, as depicted in FIG. 2A, a metal is deposited onto the upper portion of the glass substrate 1, a photoresist is coated on the upper portion of the metal, the photoresist coated on the upper portion of the metal is exposed and developed to form a photoresist pattern. The gate electrode 2A is formed by etching the metal by an etching process using the photoresist pattern as an etching mask, and the photoresist pattern is removed. Then, the insulating layer 3, the amorphous silicon 4 and the $n^+$ amorphous silicon 5 are sequentially deposited on the above structure. A photoresist is coated onto the upper surface of the $n^+$ amorphous silicon 5, then exposed and developed to form a photoresist pattern at portions opposing the upper and surrounding areas of the gate electrode 2A. Next, an active region is formed at the upper and surrounding areas of the gate electrode 2A by patterning the $n^+$ amorphous silicon 5 and the amorphous silicon 4 using an etching process employing the photoresist pattern as an etching mask, and the photoresist pattern is then removed using a wet etchant, etchant gas or the like.

As depicted in FIG. 2B, a metal is deposited onto the structure of FIG. 2A, and then a photoresist is coated thereon. After forming a photoresist pattern upon exposure and development, the metal is etched using an etching process employing the photoresist pattern as an etching mask to form a source 6A and a drain 6B being respectively separated by a certain distance above the center portion of the $n^+$ amorphous silicon 5 and formed onto a portion of the gate insulating layer 3 at the sides of the active region.

The above etching process is continued so that portions of the $n^+$ amorphous silicon 5 exposed between the source and drain 6A, 6B, and an upper portion of the amorphous silicon 4 under the $n^+$ amorphous silicon 5 are etched to define a channel region.

Next, as depicted in FIG. 2C, the passivation layer 7 is deposited onto the upper surface of the structure of FIG. 2B, and an upper portion of the drain 6B is exposed by forming a contact hole 9 through the passivation layer 7 using a photolithography process.

Finally, as depicted in FIG. 2D, a pixel contacting the exposed drain 6B is formed by depositing an ITO electrode 8 at the upper surface of the structure of FIG. 2C and patterning thereof is performed by a photolithography process.

In the process of forming the ITO electrode 8, however, the ITO electrode 8 layer may be disconnected or disjointed between the drain 6 and the passivation layer 7 and by the slope of the contact hole 9.

FIG. 3 is an enlarged cross-sectional view of the structure at the upper side in FIG. 2D. As shown therein, the drain 6B positioned at the side portion and the upper side of the active region is formed as corresponding to the step of the active region. In addition, the upper surface of the passivation film 7, which is formed on the upper surface of the drain 6B, is also unevenly formed as corresponding to the step.

Since the contact hole 9 is formed on the passivation film 7 having the uneven upper surface and the ITO electrode 8 connected to the drain 6B through the contact hole 9 is formed, the opening on the ITO electrode 8 may occur at the side surface portion by the affect of the slope on the contact hole 9, and by the problems on the depositing process of the ITO electrode 8.

FIG. 4 is a cross-sectional view in the line B–B' direction of FIG. 1, showing a section of a capacitor that is a part for storing electric charge in driving pixels. In this case the ITO electrode 8 is opened by the step or a point defect. Therefore, an inferiority in driving the device occurs since the function of storing the electric charge cannot be performed by the ITO electrode 8.

Conventionally, when problems such as a point defect or an opening in the ITO electrode 8 occurred, the panel in which a problem occurred was discarded since it could not be used for further processes.

As described above, with the conventional fabrication method of the TFT-LCD, if a point defect or the like occurs in the ITO electrode, loss in cost and time could be prevented by disposing of the electrode for the further processes, since there is no rework method of the electrode, but the cost for the former process and time loss of the process cannot be restored.

SUMMARY OF THE INVENTION

Therefore, the present invention provides at least one method of fabricating a thin film transistor-liquid crystal display device. In one preferred embodiment of the invention, the method is achieved by providing a substrate having a plurality of pixels, forming a thin-film transistor in each of the plurality of pixels, depositing a passivation layer over the substrate, and forming a pixel electrode in each of the plurality of pixels.

In another preferred embodiment of the invention, the method is achieved by forming a gate electrode on a glass substrate, depositing an insulating film and amorphous silicon on a whole upper surface of the gate insulating film and the glass substrate and forming an active region by patterning the amorphous silicon; forming a source and drain, which are at a predetermined distance from each other on a center part of the active area and located on a side surface of the active area, by depositing metal on a whole upper surface of the active area and patterning the metal; forming a contact hole exposing an upper part of the drain by deposing a passivation film and patterning the passivation film; forming a first pixel electrode, which is connected to the exposed drain, on the passivation film by depositing an indium tin oxide (ITO) and patterning the ITO; forming a second pixel electrode by depositing an ITO and patterning the ITO.

The present invention further provides a thin film transistor-liquid crystal display device. In a preferred embodiment, the device includes at least a substrate having a plurality of pixels, a thin film transistor in each of the plurality of pixels, and a first pixel electrode formed in each of the plurality of pixels. The first pixel electrode is connected with a drain electrode of the thin film transistor. The thin film transistor includes a gate electrode and an insulating layer on the substrate, an active layer formed on the insulating layer, a source electrode and a drain electrode formed over the gate electrode and at opposing ends of the active layer, and a passivation layer exposing a part of the drain electrode.

The foregoing and other, features, aspects and advantages of the present invention will become more apparent from the following detailed description when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in accompanying drawings.

FIGS. 5A to 5E are sectional views sequentially illustrating the method for fabricating a TFT in accordance with the present invention.

Figure 5A:
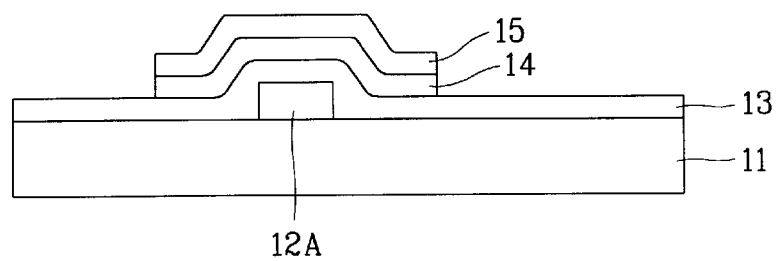
FIGS. 5A–5E are sequential cross-sectional views showing a fabrication process of TFT-LCD in accordance with the present invention.

As shown in FIG. 5A, a gate electrode 12A is formed on a glass substrate 11, and a gate insulating layer 13, an amorphous silicon 14, and an n$^+$ amorphous silicon 15 having a high density n-type ions injected therein are formed thereon. Patterning of the n$^+$ amorphous silicon 15 and the amorphous silicon 14 is done by a photolithography process to form an active region above the gate insulting layer 13 corresponding to the upper portion of the gate electrode 12A.

Figure 5B:
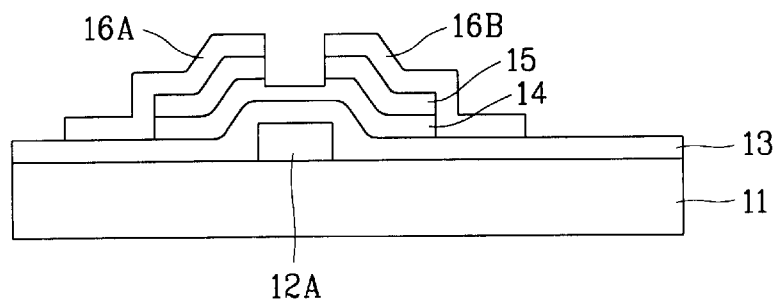

As shown in FIG. 5B, a source 16A and a drain 16B are formed by depositing a metal on the upper surface of the above structure in FIG. 5A and patterned to form respective portions separated by a pre-determined distance from the center portion of the n$^+$ amorphous silicon 5. The source and drain 16A, 16B extend over the end portions of the amorphous silicon 14 and the n$^+$ amorphous silicon 15, and onto a portion of the gate insulating layer 13. Here, portions of the n$^+$ amorphous silicon 15 exposed between the source and drain portion 16A, 16B, and an upper portion of the amorphous silicon 14 are etched to define a channel region.

Figure 5C:
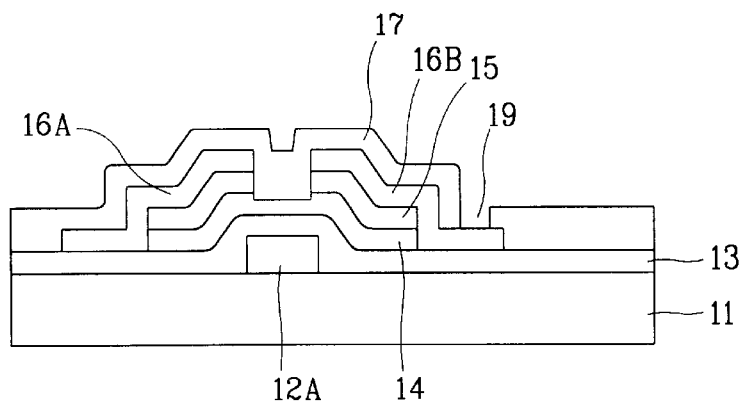

As shown in FIG. 5C, a passivation layer 17 is deposited onto the structure of FIG. 5B and a contact hole 19 is formed through a portion of the passivation layer 17 using a photolithography process to expose an upper portion of the drain 16B.

Figure 5D:
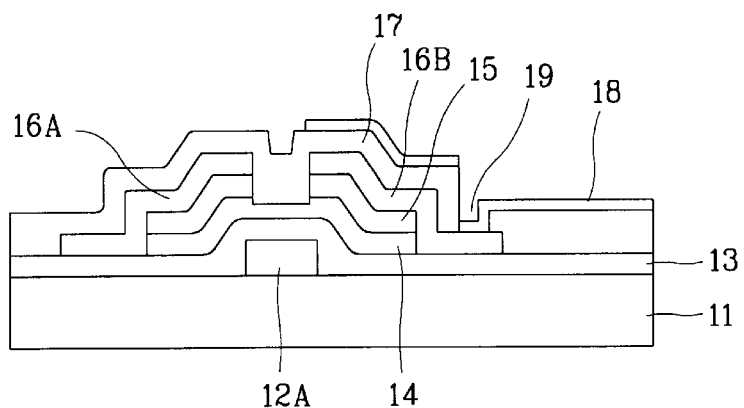

As shown in FIG. 5D, a first ITO electrode 18, which is connected to the exposed drain 16B is formed onto the structure of FIG. 5C by depositing an ITO and patterning the ITO.

Figure 5E:
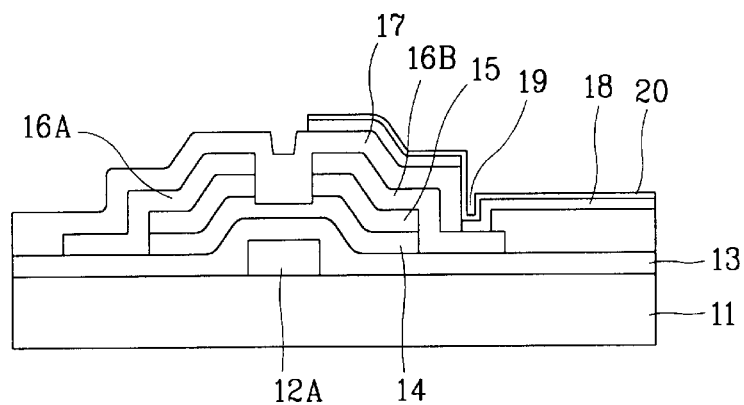

As shown in FIG. 5E, if, after testing the first ITO electrode, the first ITO electrode has a defect such as opening, a second ITO electrode 20 for rework is formed by depositing and patterning the ITO.

Hereinafter, the fabrication method of the TFT-LCD in accordance with the present invention with the above composition will be described in more detail.

As depicted in FIG. 5A, a metal is deposited onto the upper portion of the glass substrate 11, a photoresist is coated on the upper portion of the metal, the photoresist coated on the upper portion of the metal is exposed and developed to form a photoresist pattern. The gate electrode 12A is formed by etching the metal by an etching process using the photoresist pattern as an etching mask, and the photoresist pattern is removed. The insulating layer 13, the amorphous silicon 14 and the n$^+$ amorphous silicon 15 are deposited on the above structure. A photoresist is coated onto the upper surface of the n$^+$ amorphous silicon 15, exposed and developed to form a photoresist pattern at portions opposing the upper and surrounding areas of the gate electrode 12A. An active region is formed at the upper and surrounding areas of the gate electrode 12A by patterning the n$^+$ amorphous silicon 15 and the amorphous silicon 14 using an etching process employing the photoresist pattern as an etching mask, and the photoresist pattern is removed using a wet etchant. etchant gas or the like.

The active region is formed as corresponding to the step of the gate electrode 12A and has a wider width than the gate electrode 12A.

As depicted in FIG. 5B, a metal is deposited onto the structure of FIG. 5A, and a photoresist is coated thereon. After forming a photoresist pattern upon exposure and development, the metal is etched using an etching process employing the photoresist pattern as an etching mask to form a source 16A and a drain 16B being respectively separated by a pre-determined distance above the center portion of the n$^+$ amorphous silicon 15 and formed onto a portion of the gate insulating layer 13 at the sides of the active region.

The above etching process is continued so that portions of the n$^+$ amorphous silicon 15 exposed between the source and drain 16A, 16B, and an upper portion of the amorphous silicon 14 under the n$^+$ amorphous silicon 15 are etched to define a channel region.

But the step between the position where the active region is formed, that is, the region where the TFT is positioned and another region, becomes deeper by formation of the source 16A and the drain 16B.

As depicted in FIG. 5C, the passivation layer 17 is deposited onto the upper surface of the structure of FIG. 5B, and an upper portion of the drain 16B is exposed by forming a contact hole 19 through the passivation layer 17 using a photolithography process.

As depicted in FIG. 5D, a pixel contacting the exposed drain 16B is formed by forming a first ITO electrode 18 at the upper surface of the structure of FIG. 5C and patterning thereof is performed by a photolithography process.

In the process of forming the first ITO electrode 18, a point defect, that is, a discontinued part on the first ITO electrode 18 may occur by the step between the drain 16B and the passivation layer 17 and by the slope of the contact hole 19.

Namely, the drain 16B positioned at the side portion and the upper side of the active region is formed as corresponding to the step of the active region. In addition, the upper surface of the passivation film 17, which is formed on the upper surface of the drain 16B, is also unevenly formed as corresponding to the step.

Since a contact hole 19 is formed on the passivation film 17 having the uneven upper surface and the first ITO electrode 18 connected to the drain 16B through the contact hole 19 is formed, an opening on the first ITO electrode 18 may occur at the side surface portion by the affect of the slope on the contact hole 19, and by problems of the depositing process of the first ITO electrode 18.

Finally, as depicted in FIG. 5E, if a defect occurs by the opening of the first ITO electrode 18, a second ITO electrode 20 is formed again by depositing the ITO deposited in forming the first ITO electrode 18 and patterning.

If the second ITO electrode 20 is formed, the second ITO electrode 20, which is deposited at the upper side of the defect portion of the first ITO electrode 18, can be deposited uniformly by the affect of the first ITO electrode 18 which is already deposited, regardless of the slope of the contact hole 19.

The same mask used in forming the first ITO electrode 18 is used in the patterning process after forming the second ITO electrode 20. Therefore, an additional mask is not needed.

Figure 6:
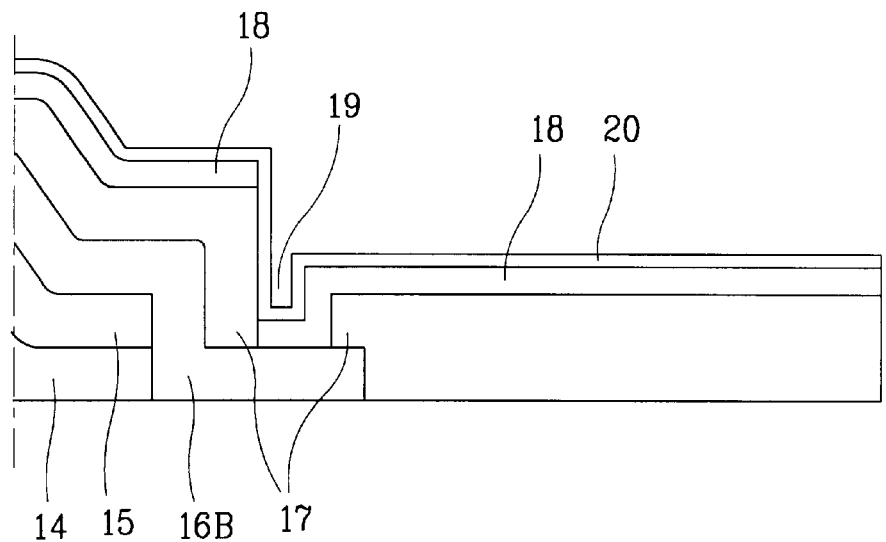
FIG. 6 is an enlarged view of FIG. 5E.

FIG. 6 is an enlarged view of the upper side of the drain in FIG. 5E. As shown in the drawing, the second ITO electrode 20 can be formed at the portion in the defect by using the first ITO electrode 18 having a defect as a seed.

Also, the thickness of the second ITO electrode 20 can be thinner than that of the first ITO electrode 18, since the first ITO electrode 18 is formed already.

Figure 1:
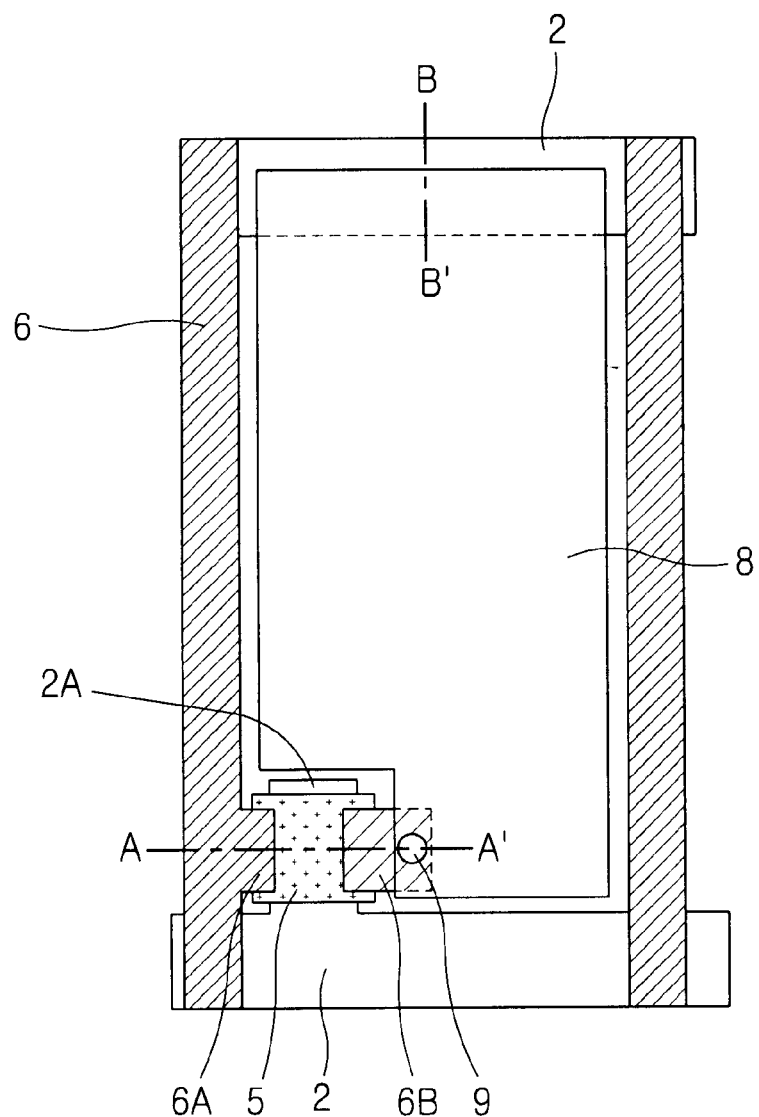
FIG. 1 is a plan view showing a conventional thin film transistor-liquid crystal display (TFT-LCD)
Figure 2A:
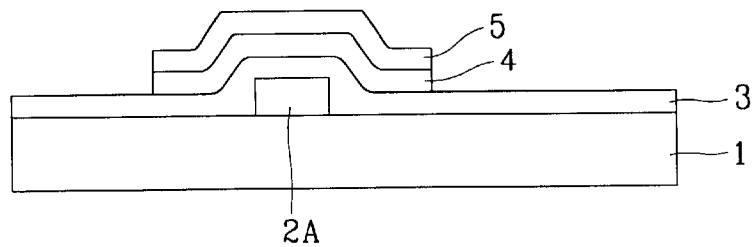
FIGS. 2A–2D are sequential cross-sectional views taken along section line A-A' showing a conventional fabrication process of TFT-LCD.
Figure 2B:
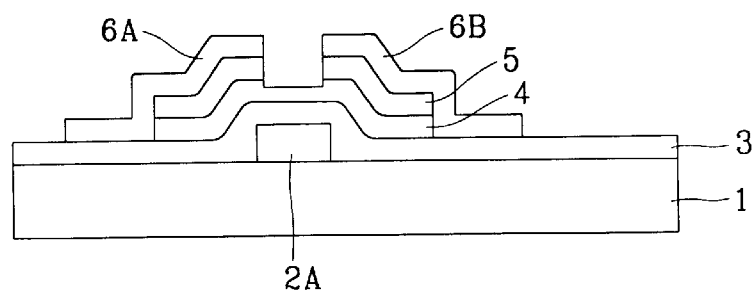
Figure 2C:
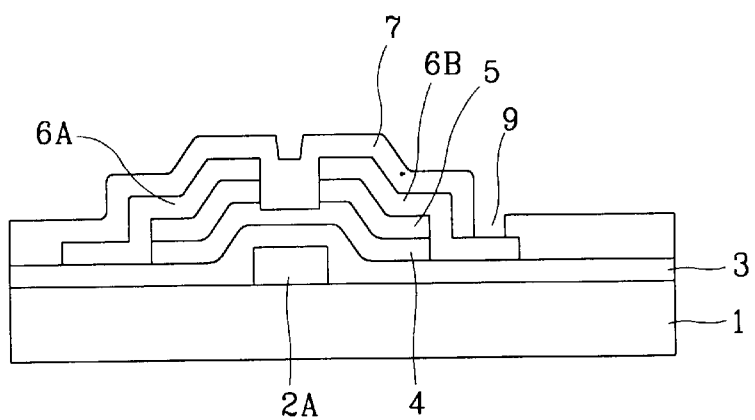
Figure 2D:
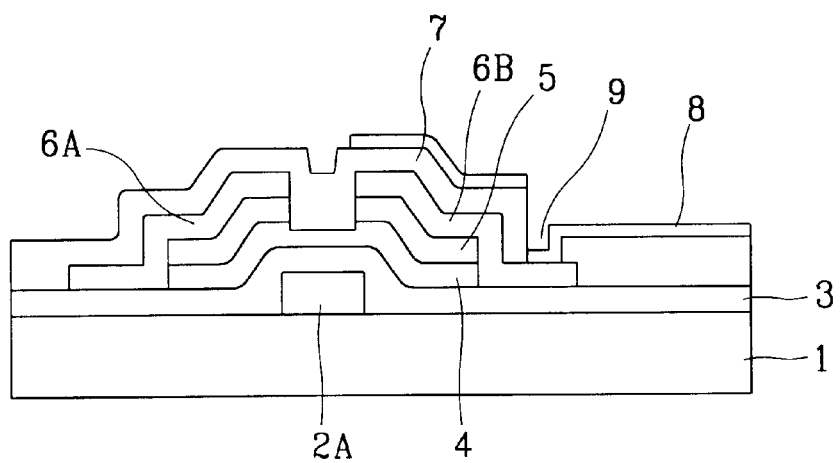
Figure 3:
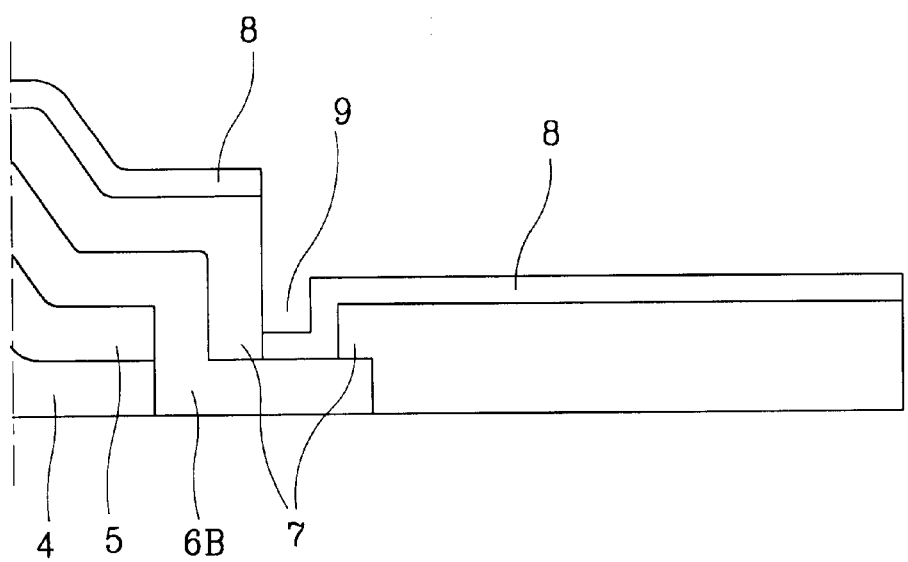
FIG. 3 is an enlarged view of FIG. 2D.
Figure 4:
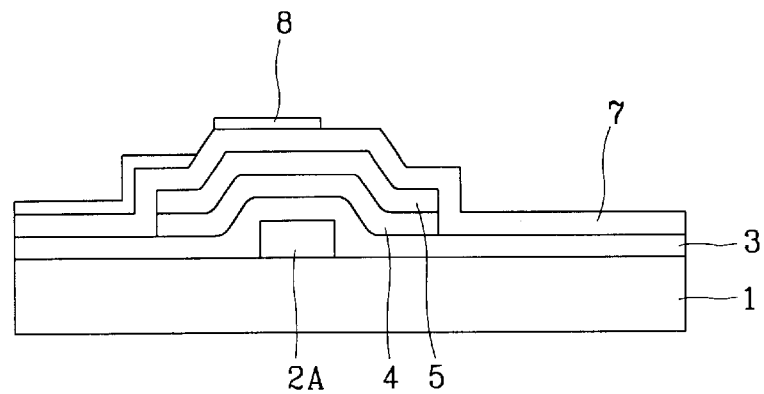
FIG. 4 is a cross-sectional view taken along section line B–B' of FIG. 1.
Figure 7:
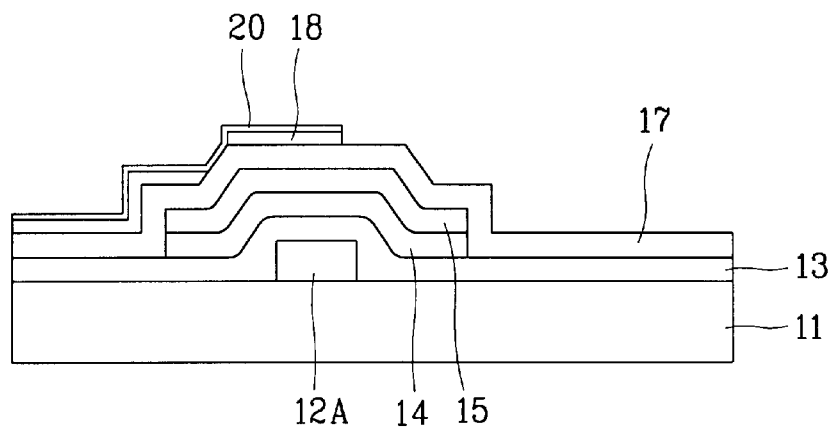
FIG. 7 is a cross-sectional view taken along section line B–B' of the TFT-LCD in accordance with the present invention.

FIG. 7 is a cross-sectional view taken along section line B–B' of the TFT in FIG. 1 in accordance with the present invention, showing the section of the capacitor for integrating the electric charge when the pixel is driven. If the first ITO electrode 18 is opened by the step or if there is a point defect which is not deposited at a certain portion, the function of storing the electric charge can be smoothly performed by restoring the defect of the first ITO electrode 18 by forming the second ITO electrode 20 on the upper surface of the first ITO electrode 18.

Namely, if the first ITO electrode 18 has a defect, in the process of forming the second ITO electrode 20 to the upper portion, development of an additional process is not necessary and the same mask can be used since the process for forming the first and second ITO electrodes 18, 20 is identical.

The rework method for ITO in TFT-LCD in accordance with the present invention uses the conventional process for forming the ITO electrode without additional development of process. The ITO electrode with a defect is re-worked by forming an ITO electrode again at the upper portion of the ITO electrode containing a defect, and accordingly, the TFT-LCD having a defect can be used, thus mitigating losses in fabrication cost and time.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method of fabricating a thin film transistor-liquid crystal display device comprising:

providing a substrate having a plurality of pixels;

forming a thin film transistor in each of the plurality of pixels;

depositing a passivation layer over the substrate;

forming a pixel electrode in each of the plurality of pixels, wherein the step of forming the pixel electrode includes:

forming a first pixel electrode by depositing and patterning an indium tin oxide on the passivation layer; and forming a second pixel electrode by depositing and patterning the indium tin oxide on the first pixel electrode.

2. The method of claim 1, wherein forming the thin film transistor comprises:

forming a gate electrode on the substrate;

depositing an insulating layer on the gate electrode;

forming an active region on the insulating layer at a portion corresponding to the gate electrode; and forming a source electrode and a drain electrode on the active region.

3. The method of claim 1, wherein a thickness of the second pixel electrode is less than that of the first pixel electrode.

4. The method of claim 1, wherein the first pixel electrode and the second pixel electrode are patterned by a lithography process using a mask with an identical pattern.

5. A method of fabricating a thin film transistor-liquid crystal display device comprising:

forming a gate electrode on a substrate;

depositing an insulating film and an amorphous silicon on the gate electrode;

forming a gate insulating layer and an active region;

forming a source electrode and a drain electrode on opposing ends of the active region;

forming a passivation layer exposing a part of the drain electrode; and forming a dual pixel electrode electrically contacting the drain.

6. A thin film transistor-liquid crystal display device comprising:

a substrate having a plurality of pixels;

a thin film transistor in each of the plurality of pixels; and a first pixel electrode formed in each of the plurality of pixels, the first electrode pixel being connected with a drain electrode of the thing film transistor, wherein the thin film transistor includes:

a gate electrode and an insulating layer on the substrate;

an active layer formed on the insulating layer;

a source electrode and a drain electrode formed over the gate electrode and at opposing ends of the active layer;

a passivation layer exposing a part of the drain electrode; and a second pixel electrode formed on the first pixel electrode.

7. The device of claim 6, wherein the first and second pixel electrodes are made of indium tin oxide.

* * * * *